(12) United States Patent
Gao et al.

(10) Patent No.: US 10,475,896 B2
(45) Date of Patent: Nov. 12, 2019

(54) SILICON CARBIDE MOSFET DEVICE AND METHOD FOR MANUFACTURING THE SAME

(71) Applicant: ZHUZHOU CRRC TIMES ELECTRIC CO., LTD., Zhuzhou, Hunan (CN)

(72) Inventors: Yunbin Gao, Hunan (CN); Chengzhan Li, Hunan (CN); Guoyou Liu, Hunan (CN); Yudong Wu, Hunan (CN); Jingjing Shi, Hunan (CN); Yanli Zhao, Hunan (CN)

(73) Assignee: ZHUZHOU CRRC TIMES ELECTRIC CO., LTD., Zhuzhou (CN)

(*) Notice: Subject to any disclaimer, the term of this patent is extended or adjusted under 35 U.S.C. 154(b) by 0 days.

(21) Appl. No.: 15/576,652

(22) PCT Filed: May 26, 2016

(86) PCT No.: PCT/CN2016/083450
§ 371 (c)(1),
(2) Date: Nov. 22, 2017

(87) PCT Pub. No.: WO2016/188448
PCT Pub. Date: Dec. 1, 2016

(65) Prior Publication Data
US 2019/0027568 A1   Jan. 24, 2019

(30) Foreign Application Priority Data
May 26, 2015  (CN) .......................... 2015 1 0274919

(51) Int. Cl.
*H01L 29/15* (2006.01)
*H01L 29/423* (2006.01)
(Continued)

(52) U.S. Cl.
CPC .. *H01L 29/42368* (2013.01); *H01L 21/02164* (2013.01); *H01L 21/02236* (2013.01);
(Continued)

(58) Field of Classification Search
CPC ........... H01L 29/42368; H01L 29/0684; H01L 29/1608; H01L 29/167; H01L 29/66068;
(Continued)

(56) References Cited

U.S. PATENT DOCUMENTS

2008/0105949 A1* 5/2008 Zhang ................. H01L 29/1608
257/584
2008/0227256 A1   9/2008 Tanimoto
(Continued)

FOREIGN PATENT DOCUMENTS

CN  102244099 A  11/2011
CN  102315264 A  1/2012
(Continued)

OTHER PUBLICATIONS

International Search Report for PCT Application No. PCT/CN2016/083450, dated Aug. 22, 2016, translation, 2 pp.

*Primary Examiner* — Tu-Tu V Ho
(74) *Attorney, Agent, or Firm* — Squire Patton Boggs (US) LLP (57) ABSTRACT

A silicon carbide MOSFET device is disclosed. The silicon carbide MOSFET device includes a gate oxide layer which is constituted by a first gate oxide layer and a second gate oxide layer. A thickness of the second gate oxide layer is larger than a thickness of the first gate oxide layer. Through dividing the gate oxide layer into two parts with different thicknesses, i.e., enabling the gate oxide layer to have a staircase shape, an electric field strength of the gate oxide layer can be effectively reduced, while a threshold voltage and a gate control property of the device are not affected. An
(Continued)

on-resistance of the device can be reduced through increasing a width of a JFET region. A method for manufacturing the silicon carbide MOSFET device is further disclosed.

27 Claims, 4 Drawing Sheets

(51) Int. Cl.
*H01L 29/16* (2006.01)
*H01L 29/66* (2006.01)
*H01L 29/167* (2006.01)
*H01L 21/02* (2006.01)
*H01L 29/78* (2006.01)
*H01L 21/04* (2006.01)
*H01L 29/06* (2006.01)

(52) U.S. Cl.
CPC ...... *H01L 21/02255* (2013.01); *H01L 21/049* (2013.01); *H01L 29/0684* (2013.01); *H01L 29/167* (2013.01); *H01L 29/1608* (2013.01); *H01L 29/66068* (2013.01); *H01L 29/7803* (2013.01)

(58) Field of Classification Search
CPC ........... H01L 29/7803; H01L 21/02164; H01L 21/02236; H01L 21/02255; H01L 21/049
USPC .......................................................... 257/77
See application file for complete search history.

(56) References Cited

U.S. PATENT DOCUMENTS

2013/0001703 A1* 1/2013 Sugawara ........... H01L 29/0661
257/378
2014/0077232 A1* 3/2014 Hino ....................... H01L 29/45
257/77
2014/0138708 A1* 5/2014 Mitani .............. H01L 21/02178
257/77

FOREIGN PATENT DOCUMENTS

CN 102376715 A 3/2012
CN 104966735 A 10/2015

* cited by examiner

SILICON CARBIDE MOSFET DEVICE AND METHOD FOR MANUFACTURING THE SAME

CROSS REFERENCE TO RELATED APPLICATIONS

The present application claims the priority of Chinese patent application CN201510274919.4, entitled "Silicon Carbide MOSFET Device and Method for Manufacturing the Same" and filed on May 26, 2015, the entirety of which is incorporated herein by reference.

FIELD OF THE INVENTION

The present disclosure relates to the technical field of semiconductors, specifically to a power device, and particularly to a silicon carbide MOSFET device and a method for manufacturing the same.

BACKGROUND OF THE INVENTION

Compared with a first generation of semiconductors with silicon (Si) as a typical example and a second generation of semiconductors with gallium arsenide (GaAs) as a typical example, silicon carbide material, as a typical one of a third generation of semiconductors, has a larger band gap and a higher critical breakdown electric field strength, and is thus suitable to produce high-voltage large-power semiconductor devices. As a research focus in international power electronic device and new material fields, silicon carbide has been drawing high attention in academic field, and has entered commercial stage under promotion of Cree, Rohm, Infineon and other companies.

As to a power device with a high performance and a high reliability, it should have a high enough voltage resistance ability to bear connection and disconnection of a main circuit at a high voltage. Meanwhile, the power device should have an on-resistance as low as possible so as to reduce working loss thereof and meet requirements of high efficiency, environmental friendly, and energy conservation. Compared with a silicon-based MOSFET (Metal-Oxide-Semiconductor Field-Effect Transistor) with a same power level, a silicon carbide MOSFET has a much lower on-resistance and switching loss, and is more suitable to work at a higher frequency. Moreover, by virtue of its capability of withstanding high temperature, stability of a silicon carbide MOSFET at high temperature has been greatly improved.

However, it should be noted that, a critical breakdown electric field strength of the silicon carbide MOSFET device can reach 2 MV/cm to 3 MV/cm, which is different from the silicon-based MOSFET device. According to the principle of continuity of electric flux at oxide interface, when the device works at a high voltage, an electric field strength of a gate oxide layer above a JFET (Junction Field Effect Transistor) region may easily exceed 4 MV/cm, which seriously affects reliability of the gate oxide layer. With respect to a silicon carbide MOSFET power device, if a width of the JFET region is too small, an on-resistance thereof will become over large; while if the width thereof is too large, a concentrated effect of an electric field curvature will become significant, and a breakdown voltage of the device will drop. Therefore, during design of the silicon carbide MOSFET device, in order to inhibit electric field concentration in the gate oxide layer and ensure reliability thereof, the on-resistance property of the device is usually sacrificed. That is, during design of the silicon carbide MOSFET device, a small JFET region width, a high P well doping concentration, and a large P well junction depth are adopted. However, according to the improvement methods in the prior art, on the one hand, the on-resistance of the device would be increased; and on the other hand, high-dose of Al ions need to be injected therein using high energy, which increase manufacturing difficulty thereof, and is not conducive to reduction of the working loss.

SUMMARY OF THE INVENTION

The present disclosure aims to provide a silicon carbide MOSFET device with a new structure. The silicon carbide MOSFET device has a staircase-shaped gate oxide layer structure. Under a condition that a width of a JFET region is not reduced, or a doping concentration of a P well and a junction depth thereof are not increased, an electric field strength in the gate oxide layer of the silicon carbide MOSFET device provided herein can be weakened. An on-resistance of the device can be further reduced through increasing the width of the JFET region while a threshold voltage thereof is maintained unchanged.

The present disclosure further provides a method for manufacturing the silicon carbide MOSFET device, especially a method for manufacturing the gate oxide layer.

According to a first aspect, the present disclosure provides a silicon carbide MOSFET device. The silicon carbide MOSFET device comprises a gate oxide layer which is constituted by a first gate oxide layer and a second gate oxide layer. A thickness of the second gate oxide layer is larger than a thickness of the first gate oxide layer. A threshold voltage of the device and an electric field strength of the gate oxide layer can be regulated through dividing the gate oxide layer into two parts with different thicknesses, i.e., enabling the gate oxide layer to have a staircase shape.

According to one preferred embodiment of the present disclosure, the silicon carbide MOSFET device is a Vertical Double-diffused MOSFET. That is, according to this embodiment, the silicon carbide MOSFET device has a basic structure and a basic operating principle of the Vertical Double-diffused MOSFET well known to those skilled in the art. On this basis, the silicon carbide MOSFET device provided herein has improved structure and performance.

According to one preferred embodiment of the present disclosure, the thickness of the second gate oxide layer is 1.5 to 4 times the thickness of the first gate oxide layer, preferably 2 to 4 times, and more preferably 2 to 3 times.

According to one preferred embodiment of the present disclosure, the thickness of the first gate oxide layer is in a range from 40 nm to 80 nm, preferably in a range from 40 nm to 60 nm.

According to one preferred embodiment of the present disclosure, the thickness of the second gate oxide layer is in a range from 60 nm to 320 nm, preferably in a range from 80 nm to 240 nm, and more preferably in a range from 80 nm to 180 nm, such as 80 nm, 100 nm, 120 nm, 140 nm, 160 nm, or 180 nm.

The silicon carbide MOSFET device provided by the present disclosure comprises a $P^+$ doped region (also called as a $P^+$ ohmic contact region), an $N^+$ source region (also called as an $N^+$ doped region), a channel, and a JFET region. According to one preferred embodiment of the present disclosure, the first gate oxide layer corresponds to a channel, one part of an $N^+$ source region, and optionally one part of a JFET region of the device, and the second gate oxide layer corresponds to at least one part of the JFET region of the device. The first gate oxide layer contacts the second gate oxide layer. Specifically, the first gate oxide layer covers a whole channel and one part of the N+ source region, and optionally covers one part of the JFET region; and the second gate oxide layer is adjacent to the first gate oxide layer, and covers at least one part of the JFET region. Preferably, the second gate oxide layer covers the whole JFET region.

According to one preferred embodiment of the present disclosure, the gate oxide layer above the channel is arranged to have a small thickness, and thus it can be ensured that the device has a suitable threshold voltage and a good gate control property; while the gate oxide layer above the JFET region is arranged to have a large thickness, so that an electric field strength of the gate oxide layer may be effectively reduced when the device works at a high voltage, and reliability of the gate oxide layer may be improved. According to this technical solution, the JFET region can be arranged to have a relatively large width so as to ensure a low on-resistance of the device.

According to one preferred embodiment of the present disclosure, a ratio of a width of the second gate oxide layer to a width of the JFET region is in a range from 2:3 to 1:1, preferably in a range from 3:4 to 1:1, and more preferably 1:1. One edge of the second gate oxide layer is aligned with one edge of the device, and therefore, when the ratio of the width of the second gate oxide layer to the width of the JFET region is below 1, an interface between the second gate oxide layer and the first gate oxide layer falls in the JFET region.

A width of the N+ source region which is covered by the first gate oxide layer depends on specific processing parameters. Preferably, the first gate oxide layer preferably covers 20% to 60% of a width of the N+ source region. Preferably, the width of the N+ source region which is covered by the first gate oxide layer is in a range from 0.5 µm to 2 µm.

The JFET region of the MOSFET device is a region which is arranged adjacent to and side by side with the P well on the N-type epitaxial layer (also called as "N− drift layer"). Specifically, the JFET region is a region between two adjacent P well regions after P wells are formed on an N drift region. According to one preferred embodiment of the present disclosure, the width of the JFET region of the device is in a range from 2 µm to 6 µm, preferably in a range from 3 µm to 5.5 µm, more preferably in a range from 3.2 µm to 5 µm, such as 3.5 µm, 3.8 µm, 4.0 µm, 4.5 µm, 5.0 µm, or 5.5 µm. In order to inhibit electric field concentration in the gate oxide layer of the device, in a traditional silicon carbide MOSFET device, the JFET region is arranged to have a small width, which is usually in a range from 2 µm to 3.5 µm. However, with respect to the silicon carbide MOSFET device provided herein, since the thickness of the gate oxide layer above the channel and the thickness of the gate oxide layer above the JFET region are arranged to be different, the width of the JFET region can be increased (such as 4.0 µm or above) so as to reduce the on-resistance of the device and avoid early breakdown of the device.

According to one preferred embodiment of the present disclosure, the width of the second gate oxide layer in a range from 2 µm to 6 µm, preferably in a range from 3.2 µm to 5.5 µm, more preferably in a range from 3.2 µm to 5 µm. A ratio of a width of the second gate oxide layer to a width of the JFET region is in a range from 2:3 to 1:1, preferably in a range from 3:4 to 1:1, and more preferably 1:1.

According to the present disclosure, the first gate oxide layer and the second gate oxide layer can have same physical properties, or can be different from each other in a suitable range. For example, the first gate oxide layer may have a higher compactness compared with the second gate oxide layer. Preferably, the first gate oxide layer and the second gate oxide layer are both made of $SiO_2$.

According to one preferred embodiment of the present disclosure, the device comprises:

a silicon carbide substrate, preferably an N-type silicon carbide substrate, more preferably a highly doped N-type silicon carbide substrate;

an N-type epitaxial layer that is epitaxially grown on the silicon carbide substrate;

a P well that is formed on the N-type epitaxial layer through Al ion injection, wherein a width of the P well is smaller than a width of the silicon carbide substrate;

a JFET region, which is arranged side by side with the P well on the N-type epitaxial layer;

a P+ doped region that is formed on the P well through Al ion injection, and an N source region that is formed on the P well through N ion injection, wherein the P doped region is adjacent to the N+ source region, and the N+ source region and the JFET region are spaced from each other by a channel;

the first gate oxide layer that is formed on the channel and one part of the N source region, and the second gate oxide layer that is formed on the JFET region, wherein the first gate oxide layer and the second gate oxide layer are preferably made of $SiO_2$; and a polysilicon gate that is deposited on the first gate oxide layer and the second gate oxide layer.

The device further comprises:

a source, which covers the P+ doped region and one part of the N+ source region adjacent to the P+ doped region;

a drain, which covers a back surface of an N+ substrate; and an N-type buffer layer that is arranged between the silicon carbide substrate and the N-type epitaxial layer.

According to one preferred embodiment of the present disclosure, a junction depth of the P well is in a range from 0.5 µm to 1.0 µm, preferably in a range from 0.6 µm to 0.8 µm, such as 0.6 µm to 0.65 µm, 0.65 µm to 0.70 µm, 0.70 µm to 0.75 µm, 0.75 µm to 0.80 µm, 0.80 µm to 0.90 µm, or 0.90 µm to 1.0 µm. An Al ion peak doping concentration of the P well is in a range from $1\times10^{18}$ $cm^{-3}$ to $1\times10^{19}$ $cm^{-3}$, preferably in a range from $1\times10^{18}$ $cm^{-3}$ to $5\times10^{18}$ $cm^{-3}$, more preferably in a range from $2\times10^{18}$ $cm^{-3}$ to $4.5\times10^{18}$ $cm^{-3}$. The Al ion peak doping concentration is a largest ion doping concentration in the P well.

According to one preferred embodiment of the present disclosure, a junction depth of the P+ doped region is in a range from 0.2 µm to 0.3 µm, and an Al ion doping concentration thereof is in a range from $1\times10^{19}$ $cm^{-3}$ to $5\times10^{19}$ $cm^{-3}$.

According to one preferred embodiment of the present disclosure, a junction depth of the N+ source region is in a range from 0.2 µm to 0.3 µm, and an N ion doping concentration thereof is in a range from $1\times10^{19}$ $cm^{-3}$ to $1\times10^{20}$ $cm^{-3}$, preferably in a range from $5\times10^{19}$ $cm^{-3}$ to $1\times10^{20}$ $cm^{-3}$.

In the silicon carbide MOSFET device provided by the present disclosure, the widths of the P+ doped region, the N+ source region and the channel and ratios between the widths thereof can be arranged in a traditional way by those skilled in the art.

According to one preferred embodiment of the present disclosure, a thickness of the N-type epitaxial layer is in a range from 10 µm to 13 µm, and an N ion doping concentration thereof is in a range from $1\times10^{15}$ cm$^{-3}$ to $9\times10^{15}$ cm$^{-3}$.

According to one preferred embodiment of the present disclosure, a thickness of the polysilicon gate is in a range from 0.4 µm to 1 µm, preferably in a range from 0.4 µm to 0.6 µm, and a P ion doping concentration thereof is in a range from $1\times10^{20}$ cm$^{-3}$ to $3\times10^{20}$ cm$^{-3}$.

According to one preferred embodiment of the present disclosure, a thickness of the N-type buffer layer is in a range from 1 µm to 2 µm, and an N ion doping concentration thereof is in $1\times10^{18}$ cm$^{-3}$ order of magnitude.

According to the present disclosure, the metal that is deposited on the source, the metal that is deposited on the drain, and the thicknesses thereof can be determined by those skilled in the art according to actual needs. According to the present disclosure, the metal is preferably at least one selected from a group consisting of Ni, Ti, and Al, more preferably Ni/Al alloy. According to one preferred embodiment of the present disclosure, the source is covered by Ni with a thickness in a range from 30 nm to 100 nm and Al with a thickness in a range from 1 µm to 3 µm. According to one preferred embodiment of the present disclosure, the drain is covered by Ni with a thickness in a range from 30 nm to 100 nm and Al with a thickness in a range from 1 µm to 3 µm.

The silicon carbide MOSFET device provided herein has a lower on-resistance compared with a traditional silicon carbide MOSFET device with a same voltage-resistance level (for example, 600 V to 3300 V). The on-resistance of the silicon carbide MOSFET device provided herein can be as low as 8 mΩ·cm$^2$ or below, or even 6 mΩ·cm$^2$ or below, for example, in a range from 3 mΩ·cm$^2$ to 6 mΩ·cm$^2$.

Figure 1:
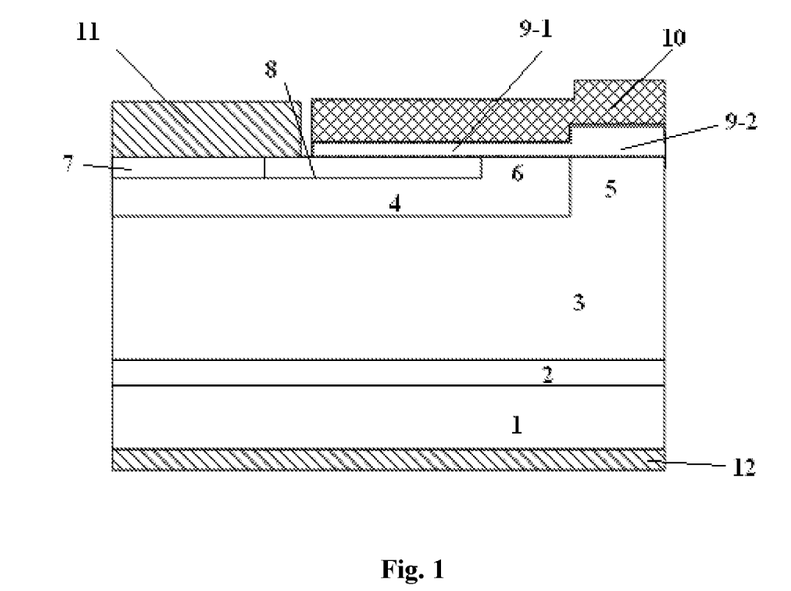
FIG. 1 schematically shows a structure of a silicon carbide MOSFET device with a staircase-shaped gate oxide layer according to one specific embodiment of the present disclosure.

The silicon carbide MOSFET device provided herein is especially suitable to serve as a cell of an active area of a planar power device. For example, as shown in FIG. 1, the silicon carbide MOSFET device only serves as one half of a cell of an active area of a power device, and the other half of the cell is mirror symmetrical with a structure as shown in FIG. 1. A cell of the silicon carbide MOSFET device provided by the present disclosure comprises the structure as shown in FIG. 1 and a structure symmetrical with the structure as shown in FIG. 1. It should be noted that, a size of each part provided herein, such as the width of the P well, the width of the JFET region, the width of the P$^+$ doped region, the width of the second gate oxide layer, the width of the polysilicon gate, and the width of the source are all based on a whole cell, and thus these sizes each are twice the sizes of the corresponding parts as shown in FIG. 1. Other width sizes are based on one half of the cell as shown in FIG. 1.

According to a second aspect, the present disclosure provides a method for manufacturing the aforesaid silicon carbide MOSFET device. The method comprises forming a second gate oxide layer and a first gate oxide layer so as to form a gate oxide layer of the device. A thickness of the second gate oxide layer is larger than a thickness of the first gate oxide layer, and the thickness of the second gate oxide layer is 1.5 to 4 times the thickness of the first gate oxide layer, preferably 2 to 4 times, more preferably 2 to 3 times. As aforementioned, the thickness of the first gate oxide layer is in a range from 40 nm to 80 nm, preferably in a range from 40 nm to 60 nm; and/or the thickness of the second gate oxide layer is in a range from 60 nm to 320 nm, preferably in a range from 80 nm to 240 nm, more preferably in a range from 80 nm to 180 nm.

If a producing condition permits, the second gate oxide layer and the first gate oxide layer can be formed respectively or in one procedure, and a forming sequence of the second gate oxide layer and the first gate oxide layer is not defined. According to one preferred embodiment of the present disclosure, considering the manufacturing difficulty, the second gate oxide layer is formed first, and the first gate oxide layer is formed later, as stated hereinbelow.

According to one preferred embodiment of the present disclosure, the method comprises:

forming a JFET region, a channel, an N$^+$ source region, and a P$^+$ doped region that are adjacent to one another in sequence, forming a gate oxide layer medium for a first time, and removing one part of the gate oxide layer medium through etching so as to form the second gate oxide layer on the JFET region;

forming a gate oxide layer medium for a second time on a region of a removed part of the gate oxide layer medium that is formed for the first time, wherein a thickness of the gate oxide layer medium formed for the second time is smaller than a thickness of the gate oxide layer medium formed for the first time;

depositing polysilicon on the second gate oxide layer and the gate oxide layer medium formed for the second time; and etching the gate oxide layer medium and the polysilicon on the P$^+$ doped region and one part of the N$^+$ source region so as to form the first gate oxide layer and a polysilicon gate which covers the first gate oxide layer and the second gate oxide layer.

Preferably, the thickness of the first gate oxide layer is in a range from 40 nm to 80 nm, preferably in a range from 40 nm to 60 nm; and/or the thickness of the second gate oxide layer is in a range from 60 nm to 320 nm, preferably in a range from 80 nm to 320 nm, more preferably in a range from 80 nm to 180 nm. The gate oxide layer medium can be selected from commonly used medium in the art, preferably SiO$_2$.

According to one preferred embodiment of the present disclosure, the JFET region, the channel, the N$^+$ source region, and the P$^+$ doped region that are adjacent to one another in sequence are formed by steps of:

providing a silicon carbide substrate;

growing an N-type epitaxial layer on the silicon carbide substrate epitaxially;

injecting Al ions into the N-type epitaxial layer (Al ions can be injected for multiple times, for example 3 to 4 times) to form a P well, wherein a width of the P well is smaller than a width of the silicon carbide substrate, and a region that is arranged side by side with the P well on the N-type epitaxial layer is a JFET region; and injecting Al ions and N ions respectively into the P well to form a P$^+$ doped region and an N$^+$ source region that are adjacent to each other, wherein the N$^+$ source region and the JFET region are spaced from each other by a channel.

According to the present disclosure, the method further comprises depositing an interlayer medium (mainly SiO$_2$), and forming an ohmic contact hole through etching. The deposition of the interlayer medium can be performed by those skilled in the art according to traditional manner.

According to the present disclosure, the method further comprises:

sputtering ohmic contact metal, preferably Ni and Al, on a surface of the P$^+$ doped region and one part of a surface of the N$^+$ source region adjacent to the P$^+$ doped region to form a source; and sputtering ohmic contact metal, preferably Ni and Al, on a back surface of the silicon carbide substrate to form a drain.

The alloy sputtered thereon serves as an ohmic contact metal between the source and the drain. After the metal layer is sputtered, the device is annealed in an $N_2$ atmosphere at a temperature of 800° C. to 1000° C., for example for 2 to 5 minutes.

According to one preferred embodiment of the present disclosure, a junction depth of the P well is in a range from 0.5 μm to 1.0 μm, preferably in a range from 0.6 μm to 0.9 μm; and an Al ion peak doping concentration of the P well is in a range from $1\times10^{18}$ $cm^{-3}$ to $1\times10^{19}$ $cm^{-3}$, preferably in a range from $1\times10^{18}$ $cm^{-3}$ to $5\times10^{18}$ $cm^{-3}$.

According to one preferred embodiment of the present disclosure, a junction depth of the $P^+$ doped region is in a range from 0.2 μm to 0.3 μm, and an Al ion doping concentration thereof is in a range from $1\times10^{19}$ $cm^{-3}$ to $5\times10^{19}$ $cm^{-3}$ According to one preferred embodiment of the present disclosure, a junction depth of the $N^+$ source region is in a range from 0.2 μm to 0.3 μm, and an N ion doping concentration thereof is in a range from $1\times10^{19}$ $cm^{-3}$ to $1\times10^{20}$ $cm^{-3}$, preferably in a range from $5\times10^{19}$ $cm^{-3}$ to $5\times10^{19}$ $cm^{-3}$.

According to one preferred embodiment of the present disclosure, a thickness of the N-type epitaxial layer is in a range from 10 μm to 13 μm, and an N ion doping concentration thereof is in a range from $1\times10^{15}$ $cm^{-3}$ to $9\times10^{15}$ $cm^{-3}$.

According to one preferred embodiment of the present disclosure, a thickness of the polysilicon gate is in a range from 0.4 μm to 1.0 μm, preferably in a range from 0.4 μm to 0.6 μm, and a P ion doping concentration thereof is in a range from $1\times10^{20}$ $cm^{-3}$ to $3\times10^{20}$ $cm^{-3}$.

According to one preferred embodiment of the present disclosure, one part of the second gate oxide layer medium formed for the first time is etched out, so that a ratio of a width of the second gate oxide layer to a width of the JFET region is in a range from 2:3 to 1:1, preferably in a range from 3:4 to 1:1, and more preferably 1:1.

According to one preferred embodiment of the present disclosure, the width of the JFET region of the device is in a range from 2 μm to 6 μm, preferably in a range from 3 μm to 5.5 μm, more preferably in a range from 3.2 μm to 5 μm.

According to one preferred embodiment of the present disclosure, the gate oxide layer medium is formed for the first time through a low pressure chemical vapor deposition technology, a wet thermal oxidation technology, or a dry thermal oxidation technology, and the gate oxide layer medium is formed for the second time through a dry thermal oxidation technology preferably in a high-temperature oxidation furnace at a temperature in a range from 1200° C. to 1350° C.

According to one preferred embodiment of the present disclosure, the gate oxide layer medium formed for the second time is formed through the dry thermal oxidation technology, while the gate oxide layer medium formed for the first time is formed through the low pressure chemical vapor deposition technology, or the wet thermal oxidation technology. In this manner, the first gate oxide layer can have a higher compactness compared with the second gate oxide layer, which is conducive to stability of the threshold voltage and the gate oxide layer, and operating reliability of the device. As to the gate oxide layer medium (for forming the second gate oxide layer) formed for the first time, it is unnecessary to use the dry thermal oxidation technology, so that not only a manufacturing difficulty may be reduced, but also a technological cost and a time cost thereof may be saved.

According to the method for manufacturing the silicon carbide MOSFET device provided herein, selective etching and second-time thermal oxidation growth of the gate oxide layer are adopted to form the gate oxide layer with a staircase shape, whereby a voltage-resistance of the silicon carbide MOSFET device may be improved, an on-resistance thereof may be reduced, and other performances thereof may be improved.

According to one specific embodiment of the present disclosure, a method for manufacturing a silicon carbide MOSFET device is provided. The method comprises steps of:

S1: providing a silicon carbide substrate;

S2: growing an N-type buffer layer on the silicon carbide substrate, wherein a thickness of the N-type buffer layer is preferably in a range from 1 μm to 2 μm, and an N ion doping concentration thereof is in $1\times10^{18}$ $cm^{-3}$ order of magnitude;

S3: growing an N-type epitaxial layer on the N-type buffer layer epitaxially, wherein a thickness of the N-type epitaxial layer is preferably in a range from 10 μm to 13 μm, and an N ion doping concentration thereof is in a range from $1\times10^5$ $cm^{-3}$ to $9\times10^{15}$ $cm^{-3}$;

S4: injecting Al ions into the N-type epitaxial layer to form a P well, wherein a junction depth of the P well is preferably in a range from 0.5 μm to 1.0 μm, more preferably in a range from 0.6 μm to 0.8 μm, an Al ion peak doping concentration thereof is in a range from $1\times10^{18}$ $cm^{-3}$ to $5\times10^{18}$ $cm^{-3}$, a width of the P well is smaller than a width of the silicon carbide substrate, and a region that is arranged side by side with the P well on the N-type epitaxial layer is a JFET region;

S5: injecting Al ions into the P well to form a $P^+$ doped region, wherein a junction depth of the $P^+$ doped region is in a range from 0.2 μm to 0.3 μm, and an Al ion doping concentration thereof is in a range from $1\times10^{19}$ $cm^{-3}$ to $5\times10^{19}$ $cm^{-3}$;

S6: injecting N ions into a region of the P well adjacent to the $P^+$ doped region to form an $N^+$ source region, wherein a junction depth of the $N^+$ source region is in a range from 0.2 μm to 0.3 μm, an N ion doping concentration thereof is in a range from $1\times10^{19}$ $cm^{-3}$ to $5\times10^{19}$ $cm^{-3}$, and forming a channel between the $N^+$ source region and the JFET region;

S7: forming $SiO_2$ for a first time on the JFET region, the channel, the $N^+$ source region, and the $P^+$ doped region, wherein a thickness of the $SiO_2$ is in a range from 80 nm to 240 nm, preferably in a range from 80 nm to 180 nm, and the $SiO_2$ is formed through a low pressure chemical vapor deposition technology, a wet thermal oxidation technology, or a dry thermal oxidation technology;

S8: removing part of the $SiO_2$ through etching to form a second gate oxide layer, wherein the second gate oxide layer covers at least one part of the JFET region of the device, and a ratio of a width of the second gate oxide layer to a width of the JFET region is in a range from 2:3 to 1:1;

S9: forming $SiO_2$ for a second time on one part of the JFET region, the channel, the $N^+$ source region, and the $P^+$ doped region except for the second gate oxide layer, wherein a thickness of the $SiO_2$ is in a range from 40 nm to 80 nm, and the $SiO_2$ is formed through a dry thermal oxidation technology at a temperature in a range from 1200° C. to 1350° C.;

S10: depositing polysilicon on the $SiO_2$, wherein a thickness of the polysilicon is preferably in a range from 0.4 μm to 0.6 μm, and a P ion doping concentration thereof is in a range from $1 \times 10^{20}$ cm$^{-3}$ to $3 \times 10^{20}$ cm$^{-3}$;

S11: removing SiO$_2$ and polysilicon from the P$^+$ doped region and one part of the N$^+$ source region through etching to form a polysilicon gate pattern;

S12: depositing an interlayer medium, and forming an ohmic contact hole through etching;

S13: depositing Ni on the P$^+$ doped region, one part of the N$^+$ source region, and a back surface of the silicon carbide substrate, and performing annealing in an inert atmosphere at a temperature in a range from 800° C. to 1000° C. for example for 2 to 5 minutes, wherein a thickness of an Ni layer formed is in a range from 30 nm to 100 nm; and S14: depositing Al on the Ni layer, wherein a thickness of an Al layer formed is in a range from 1 μm to 3 μm.

According to the present disclosure, the silicon carbide substrate used herein is a commonly used silicon carbide substrate in the art. According to the present disclosure, a highly doped N-type (N$^+$-type) silicon carbide substrate is used.

According to the present disclosure, a dry etching method is preferably used. More preferably, a Reactive Ion Etching (RIE) method is used. According to the RIE method, a 10 MHz to 100 MHz high frequency voltage is applied to two parallel planar electrodes; an ion layer with a thickness of hundreds of microns can be generated; a sample is put between the two parallel planar electrodes; and ions will hit the sample at a high speed and chemical etching is performed.

According to the present disclosure, the words such as "on," "above," or "below" refer to relative positional relationships among different regions or parts of the device in a normal working state.

According to the present disclosure, the unit "cm$^{-3}$" means "the number of a certain ion per cm$^{-3}$".

The silicon carbide MOSFET device provided herein has an improved gate oxide layer with a specific structure, i.e., a staircase-shaped gate oxide layer. Specifically, the gate oxide layer above the JFET region is arranged to have a large thickness, while the gate oxide layer above the channel is arranged to have a small thickness. In this manner, the electric field strength of the gate oxide layer can be effectively reduced, and the threshold voltage and the gate control property of the device would not be affected. That is, under a condition that the threshold voltage and the on-resistance of the device are not increased, a voltage-resistance ability and reliability of the gate oxide layer can be improved. Therefore, other parameters of the device can be arranged in a larger scope. For example, the JFET region can be arranged to have a larger width to further reduce the on-resistance of the device to 8 mΩ·cm$^2$ or below, or even 6 mΩ·cm$^2$ or below.

BRIEF DESCRIPTION OF THE DRAWINGS

The accompanying drawings provide further understandings of the present disclosure and constitute one part of the description. The drawings are used for interpreting the present disclosure together with the embodiments, not for limiting the present disclosure. In the drawings.

1: silicon carbide N-type substrate;
2: N-type buffer layer;
3: N-type epitaxial layer;
4: P well;
5: JFET region;
6: channel;
7: P$^+$ doped region;
8: N$^+$ source region;
9 and 9': gate oxide layer medium;
9-1: first gate oxide layer;
9-2: second gate oxide layer;
10: polysilicon gate;
11: source; and
12: drain.

DETAILED DESCRIPTION OF THE EMBODIMENTS

The present disclosure will be explained in details with reference to the embodiments and the accompanying drawings, whereby it can be fully understood how to solve the technical problem by the technical means according to the present disclosure and achieve the technical effects thereof, and thus the technical solution according to the present disclosure can be implemented.

According to one specific embodiment of the present disclosure, a silicon carbide MOSFET device is provided. As shown in FIG. 1, the silicon carbide MOSFET device comprises a gate oxide layer which is constituted by a first gate oxide layer 9-1 and a second gate oxide layer 9-2. A thickness of the second gate oxide layer 9-2 is larger than a thickness of the first gate oxide layer 9-1. That is, the gate oxide layer has a staircase-shaped structure.

As aforementioned, the thickness of the second gate oxide layer 9-2 is 1.5 to 4 times the thickness of the first gate oxide layer 9-1, preferably 2 to 4 times, and more preferably 2 to 3 times. The thickness of the first gate oxide layer 9-1 is in a range from 40 nm to 80 nm, preferably in a range from 40 nm to 60 nm. The thickness of the second gate oxide layer 9-2 is in a range from 60 nm to 320 nm, preferably in a range from 80 nm to 240 nm, more preferably in a range from 80 nm to 180 nm.

As shown in FIG. 1, the silicon carbide MOSFET device specifically comprises: a silicon carbide substrate 1, an N-type buffer layer 2 that is formed on the silicon carbide substrate 1, an N-type epitaxial layer 3 that is epitaxially grown on the N-type buffer layer 2, a P well 4 that is formed on the N-type epitaxial layer 3 through Al ion injection, a JFET region 5 which is arranged side by side with the P well 4 on the N-type epitaxial layer 3, a P$^+$ doped region 7 that is formed on the P well 4 through Al ion injection, an N$^+$ source region 8 that is formed on the P well through N ion injection, and a channel 6 that is formed between the N$^+$ source region 8 and the JFET region 5.

As shown in FIG. 1, in this specific embodiment, the first gate oxide layer 9-1 covers the channel 6 and one part of the N$^+$ source region 8; the second gate oxide layer 9-2 covers the JFET region 5; and the first gate oxide layer 9-1 and the second gate oxide layer 9-2 are covered by a polysilicon gate 10. As aforementioned, according to other embodiments, the second gate oxide layer 9-2 may cover only one part of the JFET region 5. For example, the second gate oxide layer 9-2 may cover 2/3 to 3/3 of a width of the JFET region 5, and at the same time, a residual part of the JFET region 5 is covered by the first gate oxide layer 9-1. The width of the JFET region of the device is in a range from 2 μm to 6 μm. The first gate oxide layer covers 20% to 60% of a width of the N$^+$ source region.

The silicon carbide MOSFET device further comprises a source 11 which is arranged on the P$^+$ doped region 7 and one part of the N$^+$ source region 8 adjacent to the P$^+$ doped region 7, and a drain 12 which is arranged below the silicon carbide substrate 1. The source 11 and the drain 12 can be made of Ni and Al. For example, the source 11 and the drain 12 can comprise an Ni layer with a thickness of 30 nm to 100 nm, and an Al layer with a thickness of 1 μm to 3 μm. An interlayer medium is arranged between the source and the gate oxide layer, and between the source and the polysilicon gate. The interlayer medium can be formed through a conventional method. The thickness and junction depth of each part of the device, and ion doping concentration thereof can be selected properly within a range as aforesaid.

The silicon carbide MOSFET device provided herein can be used to constitute an active area of a power device, specifically a cell of the active area. It should be noted that, FIG. 1 only shows one half of a cell. That is, a whole silicon carbide MOSFET device provided by the present disclosure comprises the structure as shown in FIG. 1 and the other structure which is mirror symmetrical with the structure as shown in FIG. 1. Of course, the half-cell as shown in FIG. 1 also falls in the scope of the present disclosure.

When the silicon carbide MOSFET device provided herein is enabled, a voltage bias higher than a threshold voltage thereof is applied to the gate of the device, and therefore, an inversion layer is formed on a surface of the channel; a vertical conductive pathway is formed in the device; an electric current of the device changes with a gate voltage; and a drain-source voltage drop is very small. That is, the device enters an on-state and has a low gate control resistance. When a zero voltage bias or a negative voltage bias is applied to the gate of the device, the channel is disconnected; the vertical conductive pathway in the device is also disconnected; and a high resistance drift region of the device bears a high drain-source voltage. That is, the device enters an off-state.

Figure 2:
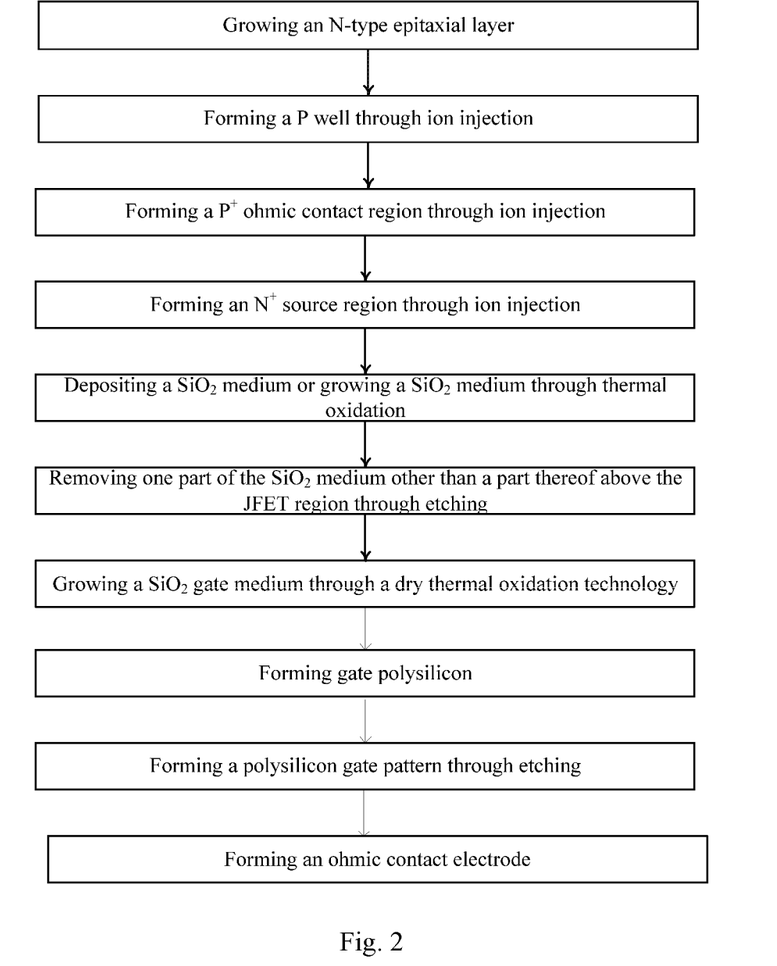
FIG. 2 is a flow chart of a method for manufacturing a silicon carbide MOSFET device with a staircase-shaped gate oxide layer according to one specific embodiment of the present disclosure.

According to one specific embodiment of the present disclosure, the silicon carbide MOSFET device can be manufactured through the method as shown in FIG. 2. The method comprises growing an N-type epitaxial layer on a silicon carbide substrate epitaxially, forming a P well through ion injection, forming a P$^+$ ohmic contact region through ion injection, forming an N$^+$ source region through ion injection, depositing a SiO$_2$ medium or growing a SiO$_2$ medium through thermal oxidation, removing one part of the SiO$_2$ medium other than a part thereof above the JFET region through etching, growing a SiO$_2$ gate medium through a dry thermal oxidation technology, forming gate polysilicon, removing one part of the SiO$_2$ gate medium that is formed through the dry thermal oxidation technology through etching to form a polysilicon gate pattern, and forming an ohmic contact electrode. It can be seen that, the method provided herein comprises steps of depositing the SiO$_2$ medium, etching the SiO$_2$ medium selectively, and forming the SiO$_2$ medium for a second time so as to form the first gate oxide layer and the second gate oxide layer respectively.

The method for manufacturing the silicon carbide MOSFET device will be illustrated hereinafter combining a specific embodiment and with reference to FIG. 3.

The method for manufacturing the silicon carbide MOSFET device specifically comprises following steps.

Figure 3A:
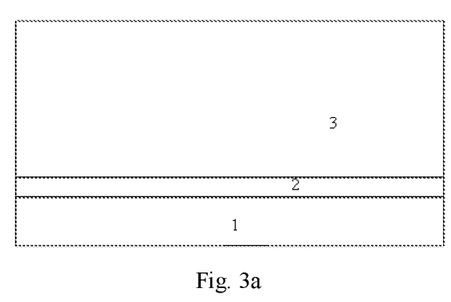
FIG. 3, which comprises FIGS. 3a to 3j, schematically shows steps of the method for manufacturing the silicon carbide MOSFET device with the staircase-shaped gate oxide layer according to one specific embodiment of the present disclosure.

In step 1, an N-type buffer layer 2 (with a thickness of 1 μm to 2 μm, and an N ion doping concentration of $1\times10^{18}$ cm$^{-3}$) is formed on a silicon carbide substrate 1, and an N-type epitaxial layer 3 (with a thickness of 10 μm to 13 μm, and an N ion doping concentration in a range from $1\times10^{15}$ cm$^{-3}$ to $9\times10^{15}$ cm$^{-3}$) is formed on the N-type buffer layer 2 epitaxially, as shown in FIG. 3a.

Figure 3B:
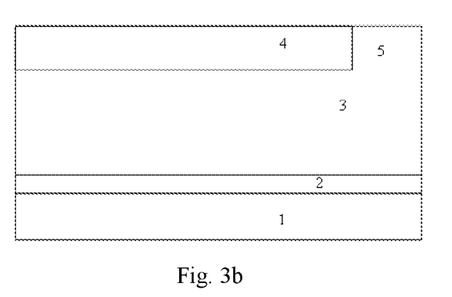

In step 2, Al ions are injected into the N-type epitaxial layer 3 to form a P well 4. A junction depth of the P well 4 is preferably in a range from 0.5 μm to 1.0 μm, and an Al ion peak doping concentration thereof is in a range from $1\times10^{18}$ cm$^{-3}$ to $1\times10^{19}$ cm$^{-3}$. A width of the P well 4 is smaller than a width of the silicon carbide substrate 1, and a region that is provided side by side with the P well 4 on the N-type epitaxial layer 3 is a JFET region 5. A width of the JFET region 5 is in a range from 2 μm to 6 μm, as shown in FIG. 3b.

Figure 3C:
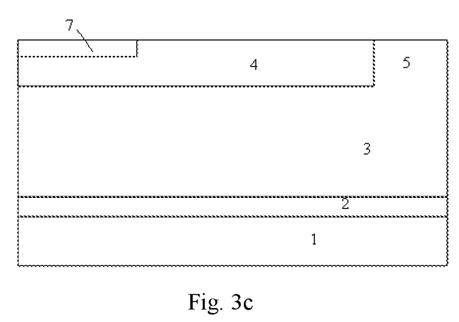

In step 3, Al ions are injected into the P well 4 to form a P$^+$ doped region 7. A junction depth of the P$^+$ doped region 7 is in a range from 0.2 μm to 0.3 μm, and an Al ion doping concentration thereof is in a range from $1\times10^{19}$ cm$^{-3}$ to $5\times10^{19}$ cm$^{-3}$, as shown in FIG. 3c.

Figure 3D:
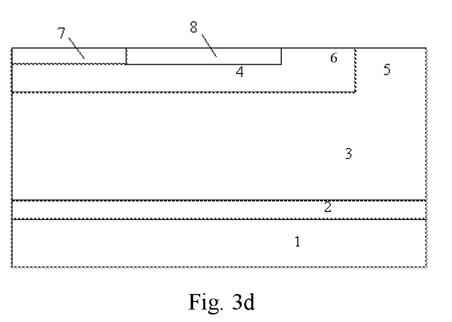

In step 4, N ions are injected into a region of the P well 4 adjacent to the P$^+$ doped region 7 to form an N$^+$ source region 8. A junction depth of the N$^+$ source region 8 is in a range from 0.2 μm to 0.3 μm, an N ion doping concentration thereof is in a range from $5\times10^{19}$ cm$^{-3}$ to $1\times10^{20}$ cm$^{-3}$, and a channel 6 is formed between the N$^+$ source region 8 and the JFET region 5, as shown in FIG. 3d.

Figure 3E:
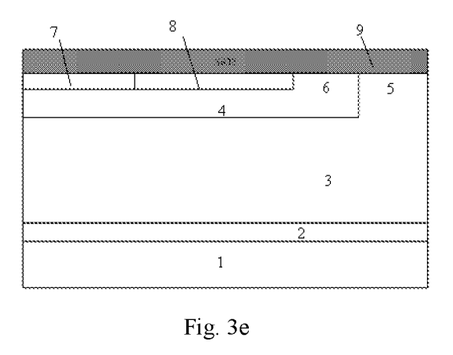

In step 5, a SiO$_2$ gate medium 9 (with a thickness of 80 nm to 320 nm, preferably 80 nm to 180 nm) is formed for a first time on the JFET region 5, the channel 6, the N$^+$ source region 8, and the P$^+$ doped region 7 through a wet thermal oxidation technology in a high-temperature oxidation furnace at a temperature in a range from 1000° C. to 1300° C., and the reaction proceeds for 10 min to 15 min, as shown in FIG. 3e.

Figure 3F:
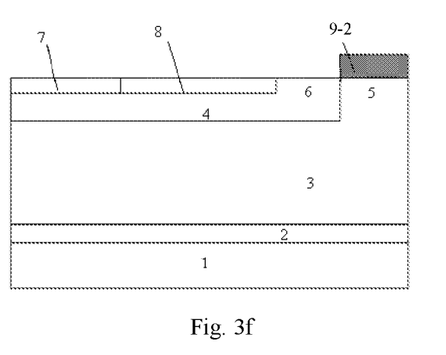

In step 6, one part of the SiO$_2$ medium 9 other than a part thereof above the JFET region is removed through an RIE (Reactive Ion Etching) method to form a second gate oxide layer 9-2. A ratio of a width of the second gate oxide layer 9-2 to a width of the JFET region 5 is in a range from 2:3 to 1:1, as shown in FIG. 3f.

Figure 3G:
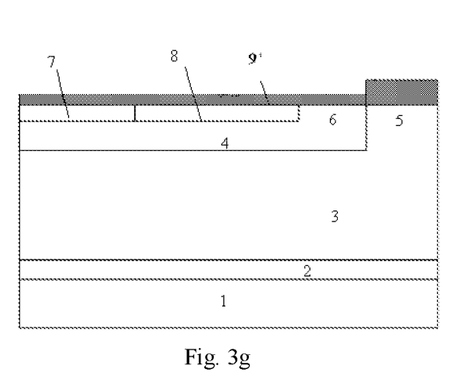

In step 7, a SiO$_2$ gate medium 9' is formed for a second time on one part of the JFET region 5, the channel 6, the N$^+$ source region 8, and the P$^+$ doped region 7 except for the second gate oxide layer 9-2. A thickness of the SiO$_2$ is in a range from 40 nm to 80 nm, and the SiO$_2$ gate medium 9' is formed through a dry thermal oxidation technology in a high-temperature oxidation furnace at a temperature in a range from 1000° C. to 1350° C., and the reaction proceeds for 20 min to 100 min, as shown in FIG. 3g.

Figure 3H:
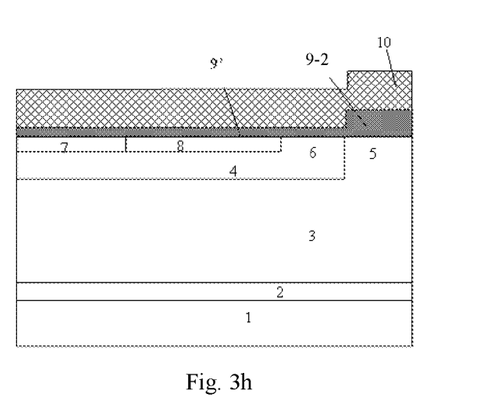

In step 8, polysilicon is deposited on the gate medium 9' and the second gate oxide layer 9-2 through a low pressure chemical vapor deposition technology. A thickness of the polysilicon is preferably in a range from 0.4 μm to 1.0 μm, and a P ion doping concentration thereof is in a range from $1\times10^{20}$ cm$^{-3}$ to $3\times10^{20}$ cm$^{-3}$, as shown in FIG. 3h.

Figure 3I:
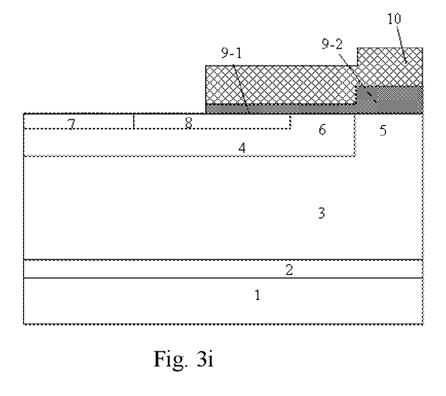

In step 9, SiO$_2$ and polysilicon are removed from the P$^+$ doped region 7 and one part of the N$^+$ source region 8 through an RIE method to form a first gate oxide layer 9-1 and a polysilicon gate 10, as shown in FIG. 3i.

In step 10, an interlayer medium (mainly SiO$_2$) is deposited, and an ohmic contact hole is formed through etching.

Figure 3J:
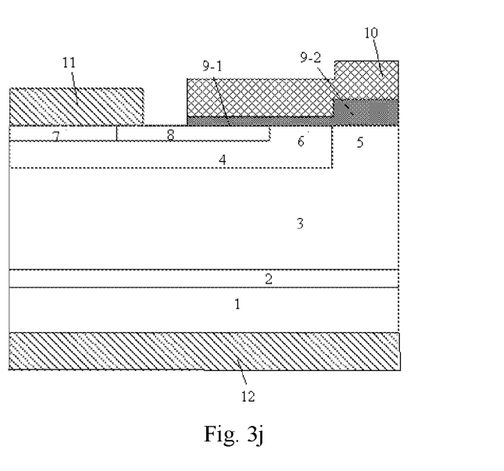

In step 11, Ni (with a thickness of 30 nm to 100 nm) is sputtered on the P$^+$ doped region, one part of the N$^+$ source region, and a back surface of the silicon carbide substrate, and is annealed in an N$_2$ atmosphere at a temperature of 800° C. to 1000° C. for 2 min to 5 min, and then Al (with a thickness of 1 μm to 3 μm) is sputtered to form a source 11, a drain 12, and an ohmic contact region, as shown in FIG. 3j.

Embodiment 1

A silicon carbide MOSFET device a is manufactured through the aforesaid method, and a voltage-resistance level of the device is 1200 V. The parameters of each of the parts of the device are as follows: the thickness of the N-type buffer layer that is formed on the silicon carbide substrate is 1 μm; the thickness of the N-type epitaxial layer is 12 μm, and the N ion doping concentration thereof is $8.5 \times 10^5$ cm$^{-3}$; the junction depth of the P well is 0.9 μm, and the Al ion doping concentration thereof is $1 \times 10^{18}$ cm$^{-3}$; the junction depth of the P$^+$ doped region is 0.3 μm, and the Al ion doping concentration thereof is $1 \times 10^{19}$ cm$^{-3}$; the junction depth of the N$^+$ source region is 0.3 μm, and the N ion doping concentration thereof is $1 \times 10^{19}$ cm$^{-3}$; the width of the JFET region is 3 μm; the width of the channel is 1 μm; the width of the second gate oxide layer, and the width of the first gate oxide layer are respectively 3 μm and 10 μm, and the thicknesses thereof are respectively 120 nm and 60 nm; the thickness of the polysilicon gate is 0.6 μm, and the P ion doping concentration thereof is $1 \times 10^{20}$ cm$^{-3}$; and the thickness of Ni that is deposited on the source and the drain is 30 nm, and the thickness of Al deposited thereon is 3 μm.

Through a Silvaco TCAD simulation software, it can be obtained that, when the device a works at a blocking voltage 1200 V, a peak electric field strength of the gate oxide layer (the first gate oxide layer and the second gate oxide layer) above the JFET region is 1.2 MV/cm, and electric field concentration phenomenon can be effectively inhibited. When the device works in an on-state, an on-resistance thereof is 5.6 mΩ·cm$^2$ under a 1.6 V positive voltage drop.

Embodiment 2

A silicon carbide MOSFET device b is manufactured through a similar method, and a voltage-resistance level of the device is 1200 V. Device b differs from device a in that: the width of the JFET region is 5 μm; and the width of the second gate oxide layer, and the width of the first gate oxide layer are respectively 5 μm and 10 μm, and the thicknesses thereof are respectively 120 nm and 60 nm.

Similar to embodiment 1, an electrical property simulation is performed on device b, and it can be obtained that, when the device b works at a blocking voltage 1200 V, a peak electric field strength of the gate oxide layer above the JFET region is 1.5 MV/cm, and electric field concentration phenomenon can be effectively inhibited. When the device works in an on-state, an on-resistance thereof is 5.3 mΩ·cm$^2$ under a 1.6 V positive voltage drop. The on-resistance of device b is lower than that of device a.

Embodiment 3

A silicon carbide MOSFET device c is manufactured through a similar method, and a voltage-resistance level of the device is 1200 V. The parameters of each of the parts of the device are as follows: the thickness of the N-type buffer layer that is formed on the silicon carbide substrate is 1 μm; the thickness of the N-type epitaxial layer is 10 μm, and the N ion doping concentration thereof is $6 \times 10^{15}$ cm$^{-3}$; the junction depth of the P well is 0.9 μm, and the Al ion doping concentration thereof is $1 \times 10^{18}$ cm$^{-3}$; the junction depth of the P$^+$ doped region is 0.3 μm, and the Al ion doping concentration thereof is $1 \times 10^{19}$ cm$^{-3}$; the junction depth of the N$^+$ source region is 0.3 μm, and the N ion doping concentration thereof is $1 \times 10^{19}$ cm$^{-3}$; the width of the JFET region is 3 μm; the width of the channel is 1 μm; the width of the second gate oxide layer, and the width of the first gate oxide layer are respectively 2 μm and 10 μm, and the thicknesses thereof are respectively 150 nm and 50 nm; the thickness of the polysilicon gate is 0.6 μm, and the P ion doping concentration thereof is $1 \times 10^{20}$ cm$^{-3}$; and the thickness of Ni that is deposited on the source and the drain is 30 nm, and the thickness of Al deposited thereon is 3 μm.

Similar to embodiment 1, an electrical property simulation is performed on device c, and it can be obtained that, when the device c works at a blocking voltage 1200 V, a peak electric field strength of the gate oxide layer above the JFET region is 1.7 MV/cm, and electric field concentration phenomenon can be effectively inhibited.

Comparative Embodiment 1

A device d is manufactured by a method similar to that of device a, and the difference thereof lies in that, the above steps 6 and 7 are omitted. Device d differs from device a in that, device d has a gate oxide layer with a single thickness of 60 nm.

Similar to embodiment 1, an electrical property simulation is performed on device d, and it can be obtained that, when the device d works at a blocking voltage 1200 V, a peak electric field strength of the gate oxide layer above the JFET region is 3.6 MV/cm, and electric field concentration phenomenon is relatively serious. In this case, the gate oxide layer would easily lose its effect if a quality thereof is not good. When the device works in an on-state, an on-resistance thereof is 5.9 mΩ·cm$^2$ under a 1.6 V positive voltage drop.

It can be seen from the above simulation results that, the electric field strength of the gate oxide layer above the JFET region of the device can be weakened by the staircase-shaped gate oxide layer structure provided by the present disclosure. In this manner, the JFET region can be designed to have a relatively larger width so as to realize a lower on-resistance.

For example, comparing the simulation results of embodiment 1 and comparative embodiment 1, it can be seen that, the electric field strength of the gate oxide layer above the JFET region of the device can be weakened by the staircase-shaped gate oxide layer structure provided by the present disclosure. That is, the electric field strength can be reduced to 1.2 MV/cm from 3.6 MV/cm of a traditional device.

In addition, comparing the simulation results of embodiment 2 and embodiment 1, it can be seen that, by increasing the width of the JFET region properly based on embodiment 1, the on-resistance can be reduced to 5.3 mΩ·cm$^2$ from 5.6 mΩ·cm$^2$, and meanwhile the electric field strength of the gate oxide layer above the JFET region is 1.5 MV/cm, which is far lower than that in comparative embodiment 1. Comparing the simulation results of embodiment 3 and embodiment 1, it can be seen that, when a ratio of the width of the second gate oxide layer to the width of the JFET region is 1:1 (embodiment 1), a better electric field strength inhibition effect can be obtained, and the electric field strength can reach as low as 1.2 MV/cm, which is lower than 1.7 MV/cm when the ratio of the width of the second gate oxide layer to the width of the JFET region is 2:3 (embodiment 3).

The wet thermal oxidation technology, the RIE technology, the dry thermal oxidation technology, and the low pressure chemical vapor deposition technology are all well-known and commonly used technologies in the art, and the details thereof will not be repeated here.

The present disclosure is illustrated in detail hereinabove. However, those skilled in the art can make amendments within the spirit and scope disclosed herein. Moreover, it can be understood that, different aspects recited herein, different parts of the embodiments, and the features thereof can be combined or replaced partly or totally. The embodiments disclosed herein can be combined with one another in a reasonable manner. It should be noted that, the contents disclosed herein are used for understanding, rather than restricting, the present disclosure.

The invention claimed is:

1. A silicon carbide MOSFET device, comprising a gate oxide layer which is constituted by a first gate oxide layer and a second gate oxide layer, wherein a thickness of the second gate oxide layer is larger than a thickness of the first gate oxide layer;
wherein the first gate oxide layer corresponds to a channel and one part of an N+ source region, and the second gate oxide layer corresponds to at least one part of a JFET region of the device;
wherein a ratio of a width of the second gate oxide layer to a width of the JFET region is 1:1, and the width of the JFET region of the device is in a range from 3.2 µm to 5.5 µm.

2. The device according to claim 1, wherein the thickness of the second gate oxide layer is 1.5 to 4 times the thickness of the first gate oxide layer.

3. The device according to claim 2, wherein the thickness of the second gate oxide layer is 2 to 4 times the thickness of the first gate oxide layer.

4. The device according to claim 2, wherein the thickness of the second gate oxide layer is 2 to 3 times the thickness of the first gate oxide layer.

5. The device according to claim 1, wherein the thickness of the first gate oxide layer is in a range from 40 nm to 80 nm; and/or
wherein the thickness of the second gate oxide layer is in a range from 60 nm to 320 nm.

6. The device according to claim 5, wherein the thickness of the first gate oxide layer is in a range from 40 nm to 60 nm; and/or
wherein the thickness of the second gate oxide layer is in a range from 80 nm to 240 nm.

7. The device according to claim 1,
wherein the first gate oxide layer covers 20% to 60% a width of the N+ source region.

8. The device according to claim 1, comprising:
a silicon carbide substrate;
an N-type epitaxial layer that is epitaxially grown on the silicon carbide substrate;
a P well that is formed on the N-type epitaxial layer through Al ion injection, wherein a width of the P well is smaller than a width of the silicon carbide substrate;
a JFET region, which is arranged side by side with the P well on the N-type epitaxial layer;
a $P^+$ doped region that is formed on the P well through Al ion injection, and an $N^+$ source region that is formed on the P well through N ion injection, wherein the $P^+$ doped region is adjacent to the $N^+$ source region, and the $N^+$ source region and the JFET region are spaced from each other by a channel;
the first gate oxide layer that is formed on the channel and one part of the $N^+$ source region, and the second gate oxide layer that is formed on the JFET region, wherein the first gate oxide layer and the second gate oxide layer are made of $SiO_2$; and
a polysilicon gate that is deposited on the first gate oxide layer and the second gate oxide layer.

9. The device according to claim 8, further comprising:
a source, which covers the $P^+$ doped region and one part of the $N^+$ source region adjacent to the $P^+$ doped region;
a drain, which covers a back surface of an $N^+$ substrate; and
an N-type buffer layer that is arranged between the silicon carbide substrate and the N-type epitaxial layer.

10. The device according to claim 8, wherein a junction depth of the P well is in a range from 0.5 µm to 1.0 µm; and
wherein an Al ion peak doping concentration of the P well is in a range from $1 \times 10^{18}$ $cm^{-3}$ to $1 \times 10^{19}$ $cm^{-3}$.

11. The device according to claim 10, wherein a junction depth of the P well is in a range from 0.6 µm to 0.8 µm; and
wherein an Al ion peak doping concentration of the P well is in a range from $1 \times 10^{18}$ $cm^{-3}$ to $5 \times 10^{18}$ $cm^{-3}$.

12. The device according to claim 8,
wherein a junction depth of the $P^+$ doped region is in a range from 0.2 µm to 0.3 µm, and an Al ion doping concentration thereof is in a range from $1 \times 10^{19}$ $cm^{-3}$ to $5 \times 10^{19}$ $cm^{-3}$; and/or
wherein a junction depth of the $N^+$ source region is in a range from 0.2 µm to 0.3 µm, and an N ion doping concentration thereof is in a range from $1 \times 10^{19}$ $cm^{-3}$ to $1 \times 10^{20}$ $cm^{-3}$.

13. The device according to claim 8,
wherein a thickness of the N-type epitaxial layer is in a range from 10 µm to 13 µm, and an N ion doping concentration thereof is in a range from $1 \times 10^{15}$ $cm^{-3}$ to $9 \times 10^{15}$ $cm^{-3}$; and/or
wherein a thickness of the polysilicon gate is in a range from 0.4 µm to 0.6 µm, and a P ion doping concentration thereof is in a range from $1 \times 10^{20}$ $cm^{-3}$ to $3 \times 10^{20}$ $cm^{-3}$.

14. The device according to claim 1, wherein an on-resistance of the device is below 6 mΩ·cm².

15. The device according to claim 14, wherein an on-resistance of the device is in a range from 1 mΩ·cm² to 5.5 mΩ·cm².

16. A method for manufacturing a silicon carbide MOSFET device, comprising forming a second gate oxide layer and a first gate oxide layer so as to form a gate oxide layer of the device, wherein a thickness of the second gate oxide layer is larger than a thickness of the first gate oxide layer;
forming a JFET region, a channel, an $N^+$ source region, and a $P^+$ doped region that are adjacent to one another in sequence, forming a gate oxide layer medium for a first time, and removing one part of the gate oxide layer medium through etching so as to form the second gate oxide layer on the JFET region;
forming a gate oxide layer medium for a second time on a region of a removed part of the gate oxide layer medium that is formed for the first time, wherein a thickness of the gate oxide layer medium formed for the second time is smaller than a thickness of the gate oxide layer medium formed for the first time;

depositing polysilicon on the second gate oxide layer and the gate oxide layer medium formed for the second time; and etching the gate oxide layer medium and the polysilicon on the $P^+$ doped region and one part of the $N^+$ source region so as to form the first gate oxide layer and a polysilicon gate which covers the first gate oxide layer and the second gate oxide layer.

17. The method according to claim 16, wherein the thickness of the second gate oxide layer is 1.5 to 4 times the thickness of the first gate oxide layer.

18. The method according to claim 16, wherein the thickness of the second gate oxide layer is 2 to 4 times the thickness of the first gate oxide layer.

19. The method according to claim 16, wherein the thickness of the first gate oxide layer is in a range from 40 nm to 80 nm; and/or wherein the thickness of the second gate oxide layer is in a range from 60 nm to 320 nm.

20. The method according to claim 19, wherein the JFET region, the channel, the $N^+$ source region, and the $P^+$ doped region that are adjacent to one another in sequence are formed by steps of:

providing a silicon carbide substrate;

growing an N-type epitaxial layer on the silicon carbide substrate epitaxially;

injecting Al ions into the N-type epitaxial layer to form a P well, wherein a width of the P well is smaller than a width of the silicon carbide substrate, and a region that is arranged side by side with the P well on the N-type epitaxial layer is a JFET region; and injecting Al ions and N ions respectively into the P well to form a $P^+$ doped region and an $N^+$ source region that are adjacent to each other, wherein the $N^+$ source region and the JFET region are spaced from each other by a channel.

21. The method according to claim 20, further comprising:

sputtering ohmic contact metal, Ni and Al, on a surface of the $P^+$ doped region and one part of a surface of the $N^+$ source region adjacent to the $P^+$ doped region to form a source; and sputtering ohmic contact metal, Ni and Al, on a back surface of the silicon carbide substrate to form a drain.

22. The method according to claim 20, wherein a junction depth of the P well is in a range from 0.5 μm to 1.0 μm, and an Al ion peak doping concentration thereof is in a range from $1\times10^{18}$ cm$^{-3}$ to $1\times10^{19}$ cm$^{-3}$;

wherein a junction depth of the $P^+$ doped region is in a range from 0.2 μm to 0.3 μm, and an Al ion doping concentration thereof is in a range from $1\times10^{19}$ cm$^{-3}$ to $5\times10^{19}$ cm$^{-3}$;

wherein a junction depth of the $N^+$ source region is in a range from 0.2 μm to 0.3 μm, and an N ion doping concentration thereof is in a range from $1\times10^{19}$ cm$^{-3}$ to $1\times10^{20}$ cm$^{-3}$;

wherein a thickness of the N-type epitaxial layer is in a range from 10 μm to 13 μm, and an N ion doping concentration thereof is in a range from $1\times10^{15}$ cm$^{-3}$ to $9\times10^{15}$ cm$^{-3}$; and/or wherein a thickness of the polysilicon gate is in a range from 0.4 μm to 0.6 μm, and a P ion doping concentration thereof is in a range from $1\times10^{20}$ cm$^{-3}$ to $3\times10^{20}$ cm$^{-3}$.

23. The method according to claim 19, wherein the thickness of the first gate oxide layer is in a range from 40 nm to 60 nm; and/or wherein the thickness of the second gate oxide layer is in a range from 80 nm to 240 nm.

24. The method according to claim 19, wherein a ratio of a width of the second gate oxide layer to a width of the JFET region is in a range from 2:3 to 1:1; and wherein the width of the JFET region of the device is in a range from 2 μm to 6 μm.

25. The method according to claim 24, wherein a ratio of a width of the second gate oxide layer to a width of the JFET region is 1:1; and wherein the width of the JFET region of the device is in a range from 3.2 μm to 5 μm.

26. The method according to claim 19, wherein the gate oxide layer medium is formed for the first time through a low pressure chemical vapor deposition technology, a wet thermal oxidation technology, or a dry thermal oxidation technology; and wherein the gate oxide layer medium is formed for the second time through a dry thermal oxidation technology at a temperature in a range from 1200° C. to 1350° C.

27. A method for manufacturing a silicon carbide MOSFET device, comprising steps of:

S1: providing a silicon carbide substrate;

S2: growing an N-type buffer layer on the silicon carbide substrate, wherein a thickness of the N-type buffer layer is in a range from 1 μm to 2 μm, and an N ion doping concentration thereof is in $1\times10^{18}$ cm$^{-3}$ order of magnitude;

S3: growing an N-type epitaxial layer on the N-type buffer layer epitaxially, wherein a thickness of the N-type epitaxial layer is in a range from 10 μm to 13 μm, and an N ion doping concentration thereof is in a range from $1\times10^{15}$ cm$^{-3}$ to $9\times10^{15}$ cm$^{-3}$;

S4: injecting Al ions into the N-type epitaxial layer to form a P well, wherein a junction depth of the P well is in a range from 0.5 μm to 1.0 μm, an Al ion peak doping concentration thereof is in a range from $1\times10^{18}$ cm$^{-3}$ to $5\times10^{18}$ cm$^{-3}$, a width of the P well is smaller than a width of the silicon carbide substrate, and a region that is arranged side by side with the P well on the N-type epitaxial layer is a JFET region;

S5: injecting Al ions into the P well to form a $P^+$ doped region, wherein a junction depth of the $P^+$ doped region is in a range from 0.2 μm to 0.3 μm, and an Al ion doping concentration thereof is in a range from $1\times10^{19}$ cm$^{-3}$ to $5\times10^{19}$ cm$^{-3}$;

S6: injecting N ions into a region of the P well adjacent to the $P^+$ doped region to form an $N^+$ source region, wherein a junction depth of the $N^+$ source region is in a range from 0.2 μm to 0.3 μm, an N ion doping concentration thereof is in a range from $1\times10^{19}$ cm$^{-3}$ to $5\times10^{19}$ cm$^{-3}$, and forming a channel between the $N^+$ source region and the JFET region;

S7: forming $SiO_2$ for a first time on the JFET region, the channel, the $N^+$ source region, and the $P^+$ doped region, wherein a thickness of the $SiO_2$ is in a range from 80 nm to 240 nm, and the $SiO_2$ is formed through a low pressure chemical vapor deposition technology, a wet thermal oxidation technology, or a dry thermal oxidation technology;

S8: removing part of the $SiO_2$ through etching to form a second gate oxide layer, wherein a ratio of a width of the second gate oxide layer to a width of the JFET region is in a range from 2:3 to 1:1;

S9: forming $SiO_2$ for a second time on one part of the JFET region, the channel, the $N^+$ source region, and the $P^+$ doped region except for the second gate oxide layer, wherein a thickness of the $SiO_2$ is in a range from 40 nm to 80 nm, and the $SiO_2$ is formed through a dry thermal oxidation technology at a temperature in a range from 1200° C. to 1350° C.;

S10: depositing polysilicon on the $SiO_2$, wherein a thickness of the polysilicon is in a range from 0.4 μm to 0.6 μm, and a P ion doping concentration thereof is in a range from $1\times10^{20}$ cm$^{-3}$ to $3\times10^{20}$ cm$^{-3}$;

S11: removing $SiO_2$ and polysilicon from the $P^+$ doped region and one part of the $N^+$ source region through etching to form a polysilicon gate pattern;

S12: depositing an interlayer medium, and forming an ohmic contact hole through etching;

S13: depositing Ni on the $P^+$ doped region, one part of the $N^+$ source region, and a back surface of the silicon carbide substrate, and performing annealing in an inert atmosphere at a temperature in a range from 800° C. to 1000° C., wherein a thickness of an Ni layer formed is in a range from 30 nm to 100 nm; and S14: depositing Al on the Ni layer, wherein a thickness of an Al layer formed is in a range from 1 μm to 3 μm.

\* \* \* \* \*